(12) United States Patent
Miyao et al.

(10) Patent No.: US 12,438,529 B2
(45) Date of Patent: Oct. 7, 2025

(54) OSCILLATION CIRCUIT

(71) Applicants: KABUSHIKI KAISHA TOSHIBA, Tokyo (JP); Toshiba Electronic Devices & Storage Corporation, Tokyo (JP)

(72) Inventors: Kazuki Miyao, Kawasaki Kanagawa (JP); Tomoharu Kambashi, Hiratsuka Kanagawa (JP); Hiroshi Yoshino, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 18/667,927

(22) Filed: May 17, 2024

(65) Prior Publication Data
US 2025/0105827 A1 Mar. 27, 2025

(30) Foreign Application Priority Data
Sep. 22, 2023 (JP) ................. 2023-158937

(51) Int. Cl.
*H03K 3/03* (2006.01)
*H03K 5/04* (2006.01)

(52) U.S. Cl.
CPC ............. *H03K 3/0315* (2013.01); *H03K 5/04* (2013.01)

(58) Field of Classification Search
CPC ............................... H03K 3/0315; H03K 5/04
See application file for complete search history.

(56) References Cited

U.S. PATENT DOCUMENTS

| 5,512,861 A * | 4/1996 | Sharma ............... H03K 3/0315 331/74 |
| 5,977,790 A | 11/1999 | Sanwo et al. |
| 7,737,767 B2 | 6/2010 | Oyama et al. |
| 9,537,476 B1 * | 1/2017 | Wadhwa .............. H03K 19/003 |
| 2002/0149398 A1 * | 10/2002 | Ingino, Jr. ........... H03K 3/0315 327/52 |
| 2019/0097577 A1 * | 3/2019 | Soares .................. H03K 3/354 |

FOREIGN PATENT DOCUMENTS

| JP | H11-150467 | 6/1999 |
| JP | 2001-292056 | 10/2001 |
| JP | 2009-124827 | 6/2009 |
| JP | 2011-061462 | 3/2011 |
| JP | 2013-081084 | 5/2013 |
| JP | 2021-015331 | 2/2021 |

* cited by examiner

*Primary Examiner* — Ryan Johnson
(74) *Attorney, Agent, or Firm* — Knobbe, Martens, Olson & Bear, LLP

(57) ABSTRACT

According to one embodiment, an oscillation circuit includes: a ring oscillator; a first transistor having a gate terminal coupled to an output port of the ring oscillator and a drain terminal coupled to a first node; a second transistor having a drain terminal and a gate terminal that are both coupled to the first node; a third transistor having a gate terminal coupled to the first node and a drain terminal coupled to a second node; a fourth transistor having a gate terminal coupled to the first node and a drain terminal coupled to a third node; a fifth transistor having a drain terminal coupled to the second node and a source terminal coupled to the third node; and a voltage buffer having an input port coupled to the second node.

18 Claims, 3 Drawing Sheets

OSCILLATION CIRCUIT

CROSS-REFERENCE TO RELATED APPLICATIONS

This application is based upon and claims the benefit of priority from Japanese Patent Application No. 2023-158937, filed Sep. 22, 2023, the entire contents of which are incorporated herein by reference.

FIELD

Embodiments described herein relate generally to an oscillation circuit.

BACKGROUND

An oscillation circuit adopting a ring oscillator has been known as an oscillator for driving a charge pump circuit.

DETAILED DESCRIPTION

In general, according to one embodiment, an oscillation circuit includes: a ring oscillator; a first transistor having a gate terminal coupled to an output port of the ring oscillator and a drain terminal coupled to a first node; a second transistor having a drain terminal and a gate terminal that are both coupled to the first node; a third transistor having a gate terminal coupled to the first node and a drain terminal coupled to a second node; a fourth transistor having a gate terminal coupled to the first node and a drain terminal coupled to a third node; a fifth transistor having a drain terminal coupled to the second node and a source terminal coupled to the third node; and a voltage buffer having an input port coupled to the second node.

The embodiments will be described below with reference to the drawings. In the description, the same reference symbols are assigned to structural components having the same functions and structures. If components having reference symbols that include the same characters do not need to be distinguished from each other, these components will be referred to by symbols including the characters only.

In the following description, the first component being "coupled" to the second component represents that the first component may be coupled to the second component, either indirectly by way of a continually or selectively conductive intermediary element, or directly without any intermediary element interposed.

1. Configuration

1.1 Overall Configuration

Figure 1:
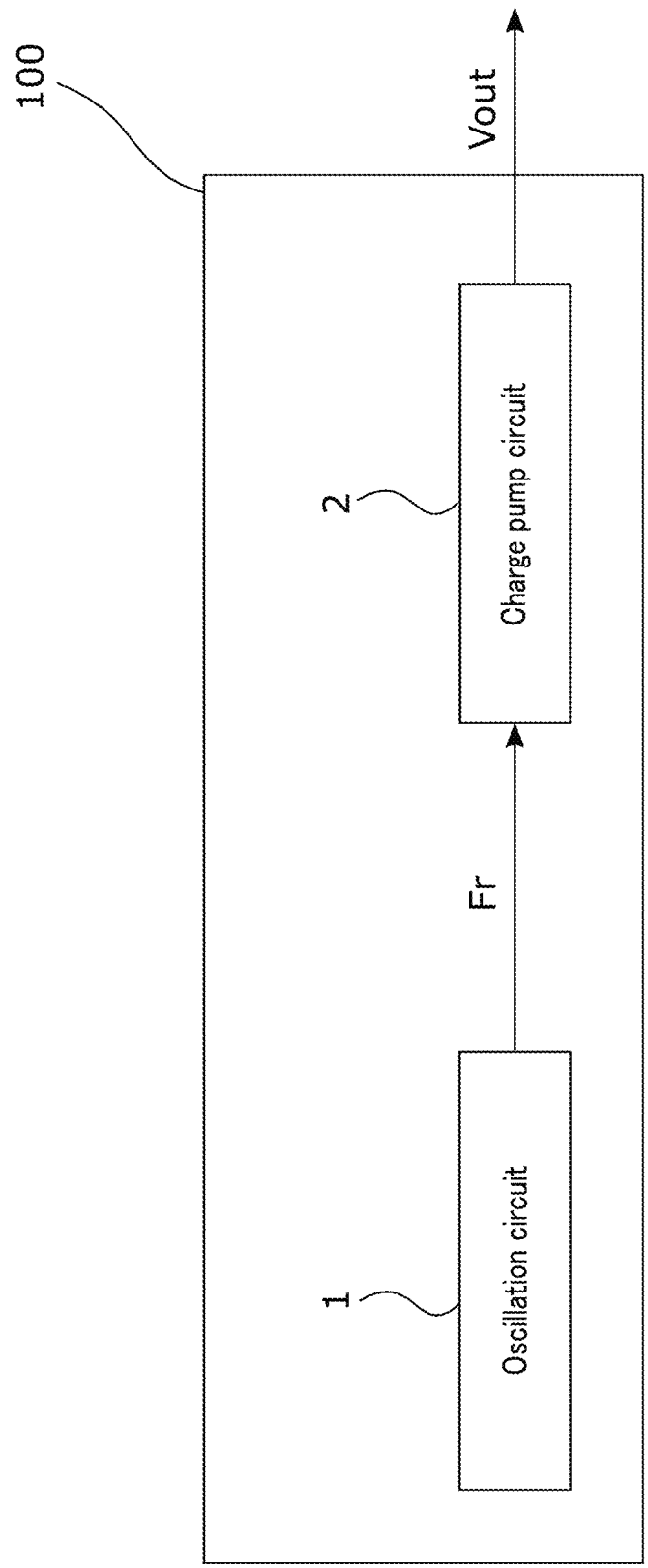
FIG. 1 is a block diagram showing an exemplary configuration of a semiconductor device adopting an oscillation circuit according to an embodiment.

First, with reference to FIG. 1, the configuration of a semiconductor device adopting an oscillation circuit according to the present embodiment will be described. FIG. 1 is a block diagram showing an exemplary configuration of a semiconductor device adopting an oscillation circuit according to the present embodiment.

As illustrated in FIG. 1, a semiconductor device 100 includes an oscillation circuit 1 and a charge pump circuit 2. The oscillation circuit 1 outputs a rectangular wave AC signal Fr to the charge pump circuit 2. The charge pump circuit 2 operates to receive the rectangular wave AC signal Fr as a clock signal. The charge pump circuit 2 boosts an input voltage to a certain level and outputs the resultant boost signal Vout to the outside of the semiconductor device 100. The semiconductor device 100 may be used for a motor control driver (MCD).

1.2 Configuration of Oscillation Circuit

Figure 2:
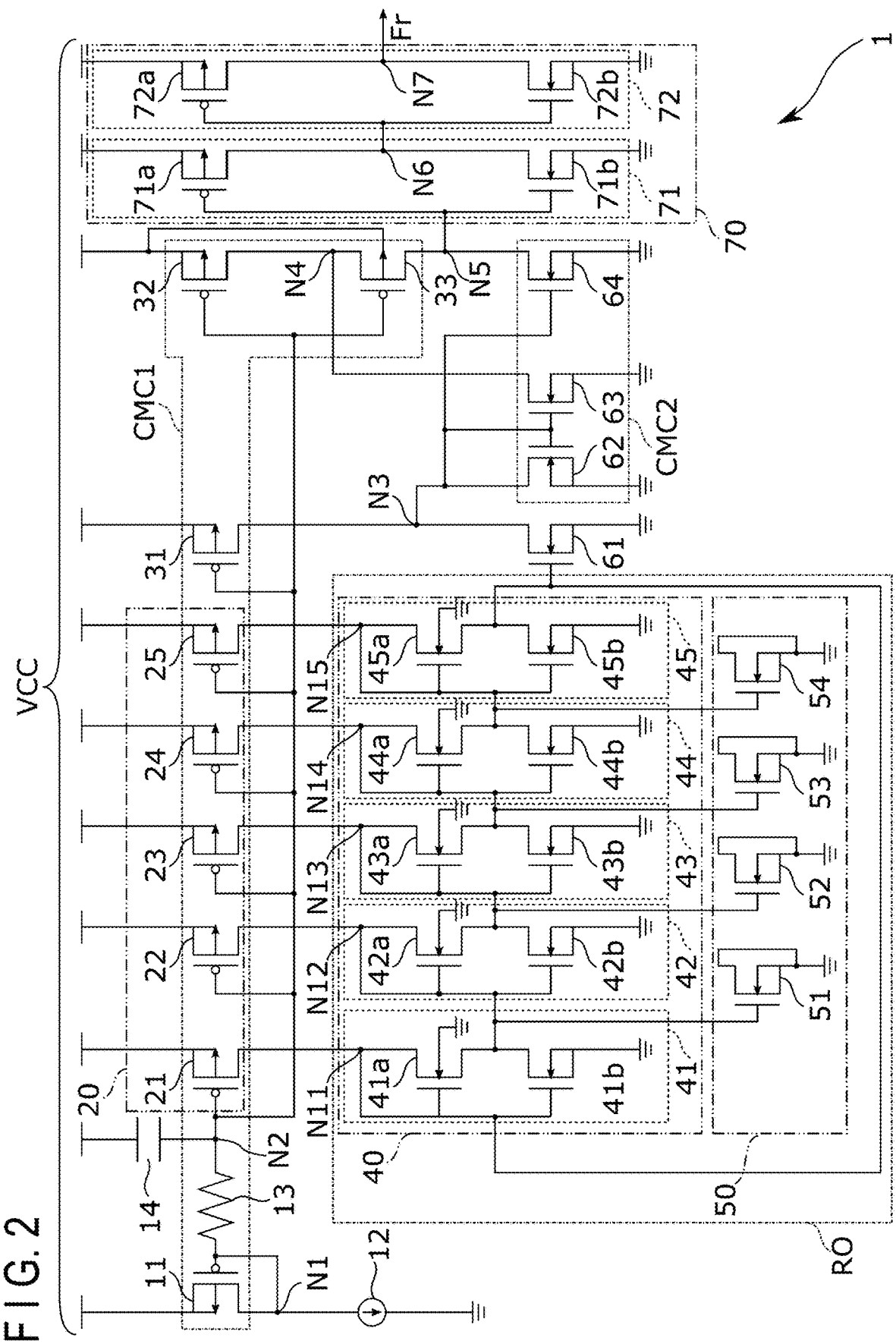
FIG. 2 is a circuit diagram showing an exemplary configuration of the oscillation circuit according to the embodiment.

Next, with reference to FIG. 2, the configuration of the oscillation circuit according to the present embodiment will be described. FIG. 2 is a circuit diagram showing an exemplary configuration of the oscillation circuit according to the embodiment.

The oscillation circuit 1 includes transistors 11, 31, 32, 33, 61, 62, 63, and 64, a current source 12, a resistor 13, a capacitor 14, a transistor group 20, an inverter group 40, a capacitor group 50, and a voltage buffer 70. The oscillation circuit 1 generates and outputs an AC signal using delays of inverters.

The transistors 11, 31, 32, 33, 61, 62, 63, and 64 may include metal oxide semiconductor field effect transistors (MOSFETs). The transistors 11, 31, 32, and 33 may include P-type MOSFETs, and the transistors 61, 62, 63, and 64 may include N-type MOSFETs.

The transistor 11 has a drain terminal and a gate terminal that are both coupled to a node N1, and a source terminal and a back-gate terminal to which a voltage VCC is supplied. The voltage VCC is a source voltage for driving the oscillation circuit 1.

The current source 12 has an input port coupled to the node N1 and an output port to which a voltage GND is supplied. The voltage GND is a ground voltage, which may be 0 volts.

The resistor 13 has a first port coupled to the node N1 and a second port coupled to a node N2.

The capacitor 14 has a first port to which a voltage VCC is supplied and a second port coupled to the node N2.

The resistor 13 and capacitor 14 function together as a low-pass filter, reducing signals with a frequency higher than a threshold value. The resistor 13 and capacitor 14 suppress superimposition of high-frequency noise, which has been caused by the current source, upon the inverter group 40.

The transistor group 20 supplies a current to the respective inverters of the inverter group 40. The transistor group 20 includes n transistors, where n is an odd number larger than or equal to 3. FIG. 2 shows an example of n=5. The following description will focus on the configuration of n=5.

The transistor group 20 includes transistors 21, 22, 23, 24, and 25. The transistors 21, 22, 23, 24, and 25 may include P-type MOSFETS.

The transistor 21 has a drain terminal coupled to a node N11, a source terminal and a back-gate terminal to which a voltage VCC is supplied, and a gate terminal coupled to the node N2.

The transistor 22 has a drain terminal coupled to a node N12, a source terminal and a back-gate terminal to which a voltage VCC is supplied, and a gate terminal coupled to the node N2.

The transistor 23 has a drain terminal coupled to a node N13, a source terminal and a back-gate terminal to which a voltage VCC is supplied, and a gate terminal coupled to the node N2.

The transistor 24 has a drain terminal coupled to a node N14, a source terminal and a back-gate terminal to which a voltage VCC is supplied, and a gate terminal coupled to the node N2.

The transistor 25 has a drain terminal coupled to a node N15, a source terminal and a back-gate terminal to which a voltage VCC is supplied, and a gate terminal coupled to the node N2.

The transistor 31 has a drain terminal coupled to a node N3, a source terminal and a back-gate terminal to which a voltage VCC is supplied, and a gate terminal coupled to the node N2.

The transistor 32 has a drain terminal coupled to a node N4, a source terminal and a back-gate terminal to which a voltage VCC is supplied, and a gate terminal coupled to the node N2.

The transistor 33 has a drain terminal coupled to a node N5, a source terminal coupled to the node N4, a gate terminal coupled to the node N2, and a back-gate terminal to which a voltage VCC is supplied.

The transistors 11, 21, 22, 23, 24, 25, 31, 32, and 33 constitute a current mirror CMC1. The current mirror CMC1 mirrors the current flowing into the transistor 11 to determine the currents flowing into the transistors 21, 22, 23, 24, 25, 31, 32, and 33.

The inverter group 40 includes n inverters, i.e., inverters in a number equal to the number of transistors in the transistor group 20. In the example of FIG. 2, the inverter group 40 includes five inverters. This exemplary configuration will be described below.

The inverter group 40 includes inverters 41, 42, 43, 44, and 45. The output of each of the inverters 41, 42, 43, 44, and 45 is input to the subsequent inverter, and the inverters 41, 42, 43, 44, and 45 are coupled in this order into a ring form. Hereinafter, an inverter that serves as a source of a signal input to a specific inverter will be referred to as an "upstream" inverter, while an inverter that serves as a destination of a signal output from this specific inverter will be referred to as a "downstream" inverter.

The inverter 41 may include transistors 41a and 41b. The transistors 41a and 41b may include N-type MOSFETs. The transistor 41a has a drain terminal and a gate terminal both coupled to the node N11, a source terminal coupled to the node N12, and a back-gate terminal to which a voltage GND is supplied. The transistor 41b has a drain terminal coupled to the node N12, a source terminal and a back-gate terminal to which a voltage GND is supplied, and a gate terminal coupled to the node N11.

The inverter 42 may include transistors 42a and 42b. The transistors 42a and 42b may include N-type MOSFETs. The transistor 42a has a drain terminal and a gate terminal both coupled to the node N12, a source terminal coupled to the node N13, and a back-gate terminal to which a voltage GND is supplied. The transistor 42b has a drain terminal coupled to the node N13, a source terminal and a back-gate terminal to which a voltage GND is supplied, and a gate terminal coupled to the node N12.

The inverter 43 may include transistors 43a and 43b. The transistors 43a and 43b may include N-type MOSFETs. The transistor 43a has a drain terminal and a gate terminal both coupled to the node N13, a source terminal coupled to the node N14, and a back-gate terminal to which a voltage GND is supplied. The transistor 43b has a drain terminal coupled to the node N14, a source terminal and a back-gate terminal to which a voltage GND is supplied, and a gate terminal coupled to the node N13.

The inverter 44 may include transistors 44a and 44b. The transistors 44a and 44b may include N-type MOSFETs. The transistor 44a has a drain terminal and a gate terminal both coupled to the node N14, a source terminal coupled to the node N15, and a back-gate terminal to which a voltage GND is supplied. The transistor 44b has a drain terminal coupled to the node N15, a source terminal and a back-gate terminal to which a voltage GND is supplied, and a gate terminal coupled to the node N14.

The inverter 45 may include transistors 45a and 45b. The transistors 45a and 45b may include N-type MOSFETs. The transistor 45a has a drain terminal and a gate terminal both coupled to the node N15, a source terminal coupled to the node N11, and a back-gate terminal to which a voltage GND is supplied. The transistor 45b has a drain terminal coupled to the node N11, a source terminal and a back-gate terminal to which a voltage GND is supplied, and a gate terminal coupled to the node N15.

Among the transistors included in the inverter group 40, the transistors 41a, 42a, 43a, 44a, and 45a function as pull-up resistors. The transistors 41b, 42b, 43b, 44b, and 45b function as switches for determining the output of the inverters.

Each of the inverters 41, 42, 43, 44, and 45 inverts the signal input from its upstream inverter and outputs the resultant signal to its downstream inverter. In other words, an inverter to which an "H" (high)-level voltage is input from its upstream inverter outputs an "L" (low)-level voltage to its downstream inverter. An inverter to which an "L"-level voltage is input from its upstream inverter outputs an "H"-level voltage to its downstream inverter.

The capacitor group 50 includes one less transistor than the n transistors in the transistor group 20. In the example of FIG. 2, the capacitor group 50 includes four transistors. This exemplary configuration will be described below.

The capacitor group 50 may include transistors 51, 52, 53, and 54. The transistors 51, 52, 53, and 54 may include MOSFETS.

The transistor 51 is a replica transistor with its drain terminal and source terminal short-circuited. The transistor 51 has a drain terminal, a source terminal, and a back-gate terminal, to each of which a voltage GND is supplied, and a gate terminal coupled to the node N12. The transistor 51 functions as a capacitor having a capacitance between the gate terminal and drain terminal and between the gate terminal and source terminal. The gate-drain capacitance of the transistor 51 approximately equals that of the transistor 61. The gate-source capacitance of the transistor 51 approximately equals that of the transistor 61.

The transistor 52 is a replica transistor with its drain terminal and source terminal short-circuited. The transistor 52 has a drain terminal, a source terminal, and a back-gate terminal, to each of which a voltage GND is supplied, and a gate terminal coupled to the node N13. The transistor 52 functions as a capacitor having a capacitance between the gate terminal and drain terminal and between the gate terminal and source terminal. The gate-drain capacitance of the transistor 52 approximately equals that of the transistor 61. The gate-source capacitance of the transistor 52 approximately equals that of the transistor 61.

The transistor 53 is a replica transistor with its drain terminal and source terminal short-circuited. The transistor 53 has a drain terminal, a source terminal, and a back-gate terminal, to each of which a voltage GND is supplied, and a gate terminal coupled to the node N14. The transistor 53 functions as a capacitor having a capacitance between the gate terminal and drain terminal and between the gate terminal and source terminal. The gate-drain capacitance of the transistor 53 approximately equals that of the transistor 61. The gate-source capacitance of the transistor 53 approximately equals that of the transistor 61.

The transistor 54 is a replica transistor with its drain terminal and source terminal short-circuited. The transistor 54 has a drain terminal, a source terminal, and a back-gate terminal, to each of which a voltage GND is supplied, and a gate terminal coupled to the node N15. The transistor 54 functions as a capacitor having a capacitance between the gate terminal and drain terminal and between the gate terminal and source terminal. The gate-drain capacitance of the transistor 54 approximately equals that of the transistor 61. The gate-source capacitance of the transistor 54 approximately equals that of the transistor 61.

The inverter group 40 and capacitor group 50 function together as a ring oscillator RO. The ring oscillator RO outputs a clock signal having V0 as an amplitude voltage. The voltage V0 is obtained by subtracting from the voltage VCC an amount of voltage decrease caused by a load capacity inside the ring oscillator RO.

The transistor 61 has a drain terminal coupled to the node N3, a source terminal and a back-gate terminal to which a voltage GND is supplied, and a gate terminal coupled to the node N11. The threshold voltage of the transistor 61 is expressed as $\alpha \times V0$, where the constant $\alpha$ satisfies $0<\alpha<1$, and the ring oscillator RO has an amplitude voltage V0. For instance, $\alpha$ may be 0.8.

The transistor 62 has a drain terminal and a gate terminal both coupled to the node N3, and a source terminal and a back-gate terminal to which a voltage GND is supplied.

The transistor 63 has a drain terminal coupled to the node N4, a source terminal and a back-gate terminal to which a voltage GND is supplied, and a gate terminal coupled to the node N3.

The transistor 64 has a drain terminal coupled to the node N5, a source terminal and a back-gate terminal to which a voltage GND is supplied, and a gate terminal coupled to the node N3.

The transistors 62, 63, and 64 constitute a current mirror CMC2. The current mirror CMC2 mirrors the current flowing into the transistor 62 to determine the current flowing into the transistors 63 and 64.

The voltage buffer 70 has an input port coupled to the node N5 and an output port coupled to the node N7. The voltage buffer 70 shapes an input AC signal (such as a trapezoidal wave signal) and thereby outputs a rectangular wave AC signal Fr to the charge pump circuit 2.

The voltage buffer 70 includes inverters 71 and 72. Each of the inverters 71 and 72 inverts an input signal to output a resultant signal. In other words, each of the inverters 71 and 72, to which an "H"-level voltage is input, outputs an "L"-level voltage, and each of the inverters 71 and 72, to which an "L"-level voltage is input, outputs an "H"-level voltage.

The inverter 71 may include transistors 71a and 71b. The transistor 71a may include a P-type MOSFET. The transistor 71a has a drain terminal coupled to the node N6, a source terminal and a back-gate terminal to which a voltage VCC is supplied, and a gate terminal coupled to the node N5. The transistor 71b may include an N-type MOSFET. The transistor 71b has a drain terminal coupled to the node N6, a source terminal and a back-gate terminal to which a voltage GND is supplied, and a gate terminal coupled to the node N5.

The inverter 72 may include transistors 72a and 72b. The transistor 72a may include a P-type MOSFET. The transistor 72a has a drain terminal coupled to the node N7, a source terminal and a back-gate terminal to which a voltage VCC is supplied, and a gate terminal coupled to the node N6. The transistor 72b may include an N-type MOSFET. The transistor 72b has a drain terminal coupled to the node N7, a source terminal to which a voltage GND is supplied, and a gate terminal and a back-gate terminal coupled to the node N6.

The voltage buffer 70 adopts half the power supply voltage VCC, i.e., voltage VCC/2, as a threshold voltage. If the voltage at the node N5 is higher than VCC/2, the voltage buffer 70 outputs VCC, and if the voltage at the node N5 is lower than VCC/2, the voltage buffer 70 outputs GND.

2. Operations

Figure 3:
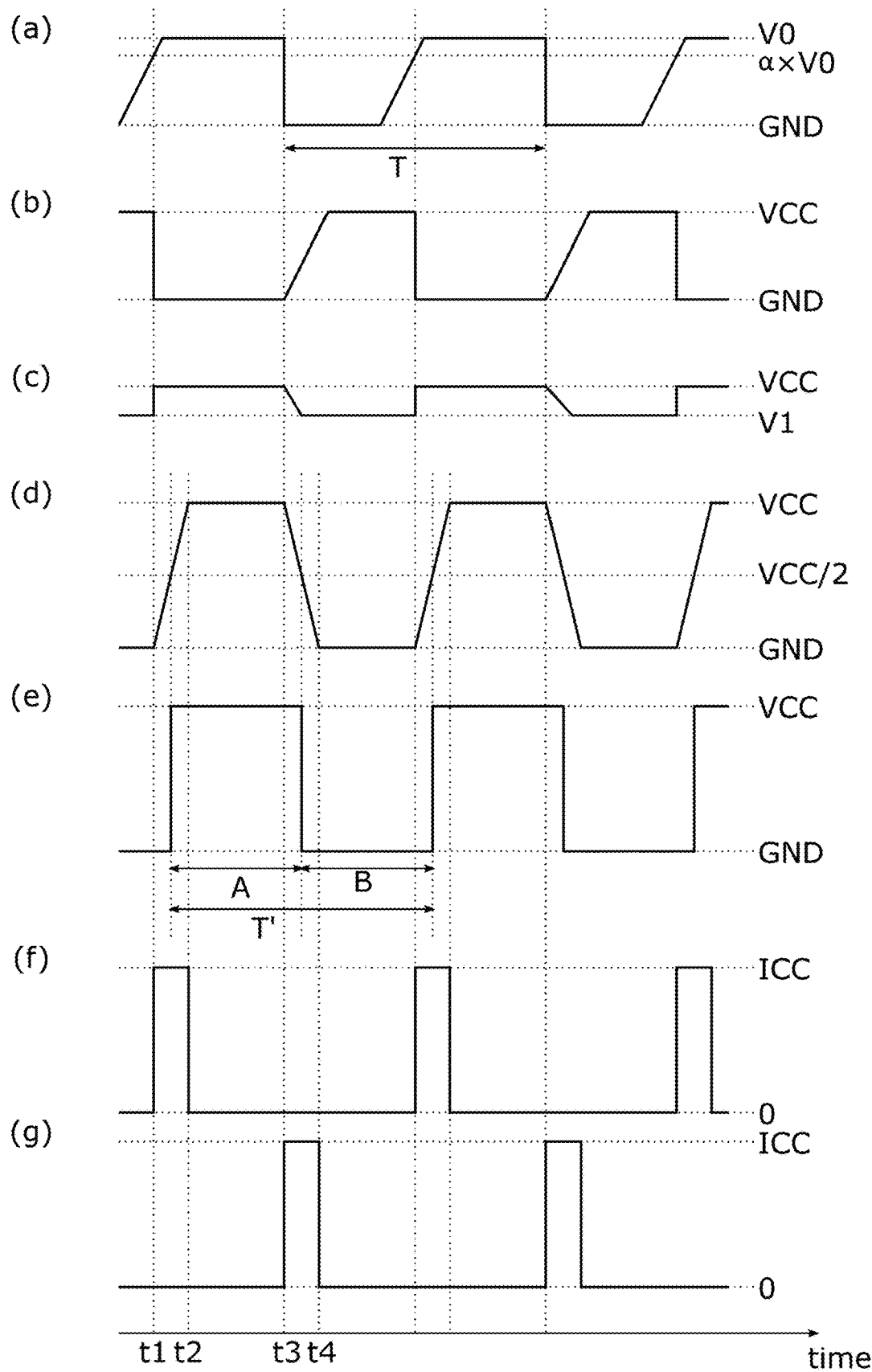
FIG. 3 is a waveform chart showing exemplary time variation of voltages applied to nodes and currents flowing through transistors at the operation of the oscillation circuit according to the embodiment.

With reference to FIG. 3, the operation of the oscillation circuit according to the present embodiment will be described. FIG. 3 is a waveform chart showing exemplary time variation of voltages applied to the nodes and currents flowing through the transistors at the operation of the oscillation circuit according to the embodiment. In FIG. 3, (a) shows the time variation of the voltage applied to the output port of the ring oscillator RO; (b) shows the time variation of the voltage applied to the node N3; (c) shows the time variation of the voltage applied to the node N4; (d) shows the time variation of the voltage applied to the node N5; (e) shows the time variation of the voltage applied to the node N7; (f) shows the time variation of the drain current flowing through the transistor 33; and (g) shows the time variation of the drain current flowing through the transistor 64.

In response to the passage of a current into the inverter group 40, each inverter alternately outputs an "H"-level voltage and an "L"-level voltage. That is, the ring oscillator RO generates a clock signal. The period is a period T from the time once the output switches to an "H"-level voltage to the time it switches to the "H"-level voltage again for the first time thereafter. The voltage applied to the node N11, which is an output port of the ring oscillator RO, varies as indicated in (a) of FIG. 3.

As illustrated in (a) of FIG. 3, the waveform of the voltage applied to the node N11 exhibits an asymmetrical form at the voltage rise time and the voltage drop time. Specifically, a voltage gradually increases at the rise, while the voltage quickly decreases at the drop. This is because at the rise an increase in the voltage is delayed due to the charging of the stray capacities in the capacitor group 50 and transistor 61 at each stage of the inverter group 40.

As illustrated in (a) of FIG. 3, within an oscillation cycle, the voltage applied to the node N11 increases to reach $\alpha \times V0$ at time t1, and this voltage decreases to reach GND at time t3.

In a period before time t1, the voltage VCC is applied to the node N3, the voltage V1 is applied to the node N4, and GND is applied to the node N5, as illustrated respectively in (b), (c), and (d) of FIG. 3. At this time, a large potential difference between the drain and source turns the transistor 32 into a pinch-off condition, and therefore the voltage V1 is a power supply voltage VCC lowered by the amount of the pinch-off voltage (e.g., 0.4 volts) of the transistor 32.

At time t1, as indicated in (b) of FIG. 3, the voltage of the node N3 is quickly reduced to GND. Through this reduction, the pinch-off condition of the transistor 32 is resolved, and the voltage at node N4 quickly increases to reach VCC as indicated in (c) of FIG. 3. Finally, a potential difference between the drain and source of the transistor 33 reaches VCC, with the voltage at node N5 being GND, and therefore a drain current of ICC flows into the transistor 33 at time t1, as indicated in (f) of FIG. 3. The drain current of the transistor 33 becomes the source current to the input port of the voltage buffer 70, and the voltage at node N5 gradually increases as indicated in (d) of FIG. 3.

After time t1, the time at which the current at node N5 reaches VCC within the same oscillation cycle will be referred to as time t2. At time t2, a potential difference is no longer present between the drain and source of the transistor 33, which stops the drain current flowing through the transistor 33, as indicated in (f) of FIG. 3.

Between times t2 and t3, GND is applied to the node N3, the voltage VCC is applied to the nodes N4 and N5, as indicated in (b), (c), and (d) of FIG. 3.

At time t3, the voltage at node N3 starts gradually increasing, as indicated in (b) of FIG. 3. As for the transistors 62, 63, and 64, which constitute a current mirror CMC2, currents corresponding to the varying voltage of the node N3 flow into the transistors 62, 63, and 64 respectively. This gradually lowers the voltage at node N4, as shown in (c) of FIG. 3. Furthermore, at time t3, a potential difference of VCC is produced between the drain and source of the transistor 64 with the voltage at node N5 being VCC, and a drain current of the amount ICC flows into the transistor 64, as indicated in (g) of FIG. 3. The drain current of the transistor 64 serves as a sink current to the input port of the voltage buffer 70, and the voltage at node N5 thereby starts at time t3 to gradually decrease, as shown in (d) of FIG. 3.

After time t3, the time at which the current at node N5 is first lowered to GND within the same oscillation cycle will be referred to as time t4. At time t4, a potential difference is no longer present between the drain and source of the transistor 64, which stops the drain current flowing through the transistor 64, as indicated in (g) of FIG. 3. The voltage at node N3 increases to reach VCC around time t4, as indicated in (b) of FIG. 3. The voltage at node N4 decreases to reach V1 before time t4, and thereafter stays at voltage V1, as indicated in (c) of FIG. 3. In this manner, the potentials of the nodes are reset to the respective states before the increase in the voltage at node N11.

The drain current of ICC flowing into the transistor 33 from time t1 to time t2 is equal to the drain current of ICC flowing into the transistor 64 from time t3 to time t4, and the potential difference between the drain and source from time t1 to time t2 is equal to the potential difference between the drain and source from time t3 to time t4. The length between times t1 and t2 therefore becomes equal to the length between times t3 and t4. As a result, the slew rate during the voltage increase at node N5 between times t1 and t2 is symmetric to the slew rate during the voltage decrease between times t3 and t4, as shown in (d) of FIG. 3.

In response to an input of the varying voltage of the node N5 to the voltage buffer 70 in (d) of FIG. 3, a rectangular wave signal in (e) of FIG. 3 is output. The cycle T' of this rectangular wave signal is approximately equal to the output cycle T of the inverter group 40. Furthermore, the time period (A) of the output voltage being VCC in (e) of FIG. 3 is approximately equal to the time period (B) of the output voltage being GND.

3. Effects

The configuration according to the present embodiment offers an oscillation circuit that can generate a rectangular wave AC signal having a duty cycle of approximately 50% without requiring a frequency divider or the like. The effects of the embodiment will be described below.

In the configuration according to the present embodiment, a current mirror circuit is coupled to a clock output, and the output of the current mirror circuit is received on the upstream side and downstream side of the node N5. With this configuration, the source current flowing through the transistor 33 coupled to the upstream side of the node N5 and the sink current flowing through the transistor 64 coupled to the downstream side of the node N5 are in the same amount, which means that the slew rate of the output clock signal at a voltage rise is approximately the same as the slew rate at a voltage drop. Thus, a rectangular wave AC signal Fr obtained by shaping this clock signal demonstrates a duty cycle of approximately 50%. This can satisfy the characteristics of a system, such as a charge pump, which is dependent on the duty cycle of a clock signal to which a system behavior is input. In addition, since a duty cycle of a clock signal of approximately 50% can be achieved without adding a frequency divider or the like, the power consumption and the size of a chip can be reduced.

Furthermore, with the configuration of the present embodiment, the output port of the current mirror coupled to the upstream side of the node N5 is coupled to the middle point of the two series-coupled transistors 32 and 33 so that the voltage can be reliably lowered to GND at the time of a voltage drop at node N5. This can avoid a condition of a duty cycle not becoming 50% due to the voltage at node N5 failing to drop to GND.

In a configuration that achieves the 50% duty cycle without using a frequency divider, it is required that the clock signal output from the ring oscillator demonstrate a 50% duty cycle. In the configuration of the present embodiment, the transistors 51, 52, 53 and 54, which respectively have the same capacitance as the gate-drain capacitance and gate-source capacitance of the transistor 61 coupled to the output port of the inverter group, are coupled as replica transistors to the corresponding stages of the inverter group 40. This configuration achieves the same load capacitance at different stages of the inverter group 40, and therefore can adjust the duty cycle of a signal output from the ring oscillator RO to approximately 50%.

4. Modification Examples

Various modifications can be made to the above-described oscillation circuit 1. The modification examples are described below.

The configuration of the inverters 41, 42, 43, 44, 45, 71, and 72 in the oscillation circuit 1 is not limited to the one described in the embodiment. For instance, the inverters 41, 42, 43, 44, and 45 may be constituted by P-type MOSFETs and N-type MOSFETs.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An oscillation circuit comprising:
   a ring oscillator;
   a first transistor having a gate terminal coupled to an output port of the ring oscillator and a drain terminal coupled to a first node;
   a second transistor having a drain terminal and a gate terminal that are both coupled to the first node;
   a third transistor having a gate terminal coupled to the first node and a drain terminal coupled to a second node;
   a fourth transistor having a gate terminal coupled to the first node and a drain terminal coupled to a third node;
   a fifth transistor having a drain terminal coupled to the second node and a source terminal coupled to the third node; and
   a voltage buffer having an input port coupled to the second node.

2. The oscillation circuit according to claim 1, further comprising:
   a sixth transistor having a drain terminal coupled to the third node.

3. The oscillation circuit according to claim 2, further comprising:
   a seventh transistor having a drain terminal and a gate terminal that are both coupled to a fourth node; and
   a current source having a first port coupled to the fourth node,
   wherein a gate terminal of the fifth transistor and a gate terminal of the sixth transistor are coupled to the fourth node.

4. The oscillation circuit according to claim 3, wherein
   the first transistor, the second transistor, the third transistor, and the fourth transistor have a first conductive type,
   the fifth transistor, the sixth transistor, and the seventh transistor have a second conductive type, which differs from the first conductive type.

5. The oscillation circuit according to claim 1, wherein
   the ring oscillator includes a first inverter, a second inverter, and a third inverter,
   the first inverter has an input port coupled to a fifth node and an output port coupled to a sixth node,
   the second inverter has an input port coupled to the sixth node and an output port coupled to a seventh node,
   the third inverter has an input port coupled to the seventh node and an output port coupled to the fifth node, and
   the fifth node serves as the output port of the ring oscillator.

6. The oscillation circuit according to claim 5, wherein
   the ring oscillator further includes a first capacitor and a second capacitor,
   the first capacitor has a first port coupled to the sixth node and a second port that is grounded, and
   the second capacitor has a first port coupled to the seventh node and a second port that is grounded.

7. The oscillation circuit according to claim 6, wherein
   the first capacitor includes an eighth transistor, the eighth transistor having a gate terminal coupled to the sixth node, and a drain terminal and a source terminal that are grounded, and
   the second capacitor includes a ninth transistor, the ninth transistor having a gate terminal coupled to the sixth node, and a drain terminal and a source terminal that are grounded.

8. The oscillation circuit according to claim 7, wherein
   each of a gate-source capacitance of the eighth transistor and a gate-source capacitance of the ninth transistor is approximately equal to a gate-source capacitance of the first transistor, and
   each of a gate-drain capacitance of the eighth transistor and a gate-drain capacitance of the ninth transistor is approximately equal to a gate-drain capacitance of the first transistor.

9. The oscillation circuit according to claim 3, further comprising:
   a resistor coupled between the fourth node and the seventh transistor; and
   a third capacitor having one port coupled to the fourth node.

10. The oscillation circuit according to claim 1, wherein
    the ring oscillator includes N inverters coupled to each other in a ring shape, where N is an odd number larger than or equal to 3, and
    the N inverters include a third inverter having an output port that corresponds to the output port of the ring oscillator.

11. The oscillation circuit according to claim 10, wherein
    the ring oscillator further includes (N−1) capacitors each having a first port and a second port that is grounded, and
    the first port of an i-th capacitor of the (N−1) capacitors coupled to an output port of an i-th inverter of (N−1) inverters excluding the third inverter of the N inverters, where i is any number that is 1 or larger and (N−1) or smaller.

12. The oscillation circuit according to claim 11, wherein
    each of the (N−1) capacitors includes one of (N−1) transistors, and
    an i-th transistor of the (N−1) transistors has a gate terminal corresponding to the first port of the i-th capacitor of the (N−1) capacitors and a drain terminal and a source terminal which are grounded and which correspond to the second port of the i-th capacitor of the (N−1) capacitors, where i is any number that is 1 or larger and (N−1) or smaller.

13. The oscillation circuit according to claim 12, wherein
    a gate-source capacitance of each of the (N−1) transistors is approximately equal to a gate-source capacitance of the first transistor, and
    a gate-drain capacitance of each of the (N−1) transistors is approximately equal to a gate-drain capacitance of the first transistor.

14. The oscillation circuit according to claim 1, wherein
    the voltage buffer includes a fourth inverter and a fifth inverter that are coupled in series.

15. An oscillation circuit comprising:
    a ring oscillator;
    a current mirror circuit having an input port, a first output port, and a second output port, the input port being coupled to an output port of the ring oscillator; and
    a voltage buffer having an input port to which a source current is input based on a first current that flows into the first output port of the current mirror circuit and to which a sink current is input based on a second current that flows into the second output port of the current mirror circuit, wherein the source current is in approximately the same amount as the sink current.

16. The oscillation circuit according to claim 15, wherein the first output port of the current mirror circuit is coupled between two transistors that are coupled in series.

17. The oscillation circuit according to claim 15, wherein the source current starts flowing in response to a rise of a signal output from the ring oscillator,
the sink current starts flowing in response to a drop of the signal output from the ring oscillator, and
a time period during which the source current flows and a time period during which the sink current flows have a length approximately equal to each other within a cycle of the signal output from the ring oscillator.

18. The oscillation circuit according to claim 15, wherein a clock signal input to the voltage buffer has a gradient at a rise and a gradient at a drop that are approximately equal to each other.

* * * * *